United States Patent
Blalock et al.

(10) Patent No.: US 6,277,759 B1
(45) Date of Patent: *Aug. 21, 2001

(54) PLASMA ETCHING METHODS

(75) Inventors: Guy T. Blalock; David S. Becker; Kevin G. Donohoe, all of Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/141,775

(22) Filed: Aug. 27, 1998

(51) Int. Cl.$^7$ ................................................ H01L 21/3065
(52) U.S. Cl. ......................... 438/706; 438/710; 438/712; 438/714
(58) Field of Search .................... 438/706, 710, 438/711, 712, 725, 723; 156/643.1, 646.1; 134/1.1

(56) References Cited

U.S. PATENT DOCUMENTS

| | | | |
|---|---|---|---|
| 4,513,021 | * 4/1985 | Purdes et al. | 427/38 |
| 4,528,066 | * 7/1985 | Merkling et al. | 156/643 |
| 5,242,538 | * 9/1993 | Hamrah et al. | 156/643 |
| 5,356,478 | 10/1994 | Chen et al. | 134/1 |
| 5,468,686 | 11/1995 | Kawamoto | 437/229 |
| 5,514,247 | * 5/1996 | Shan et al. | 156/643.1 |
| 5,593,540 | * 1/1997 | Tomita et al. | 216/67 |

(List continued on next page.)

OTHER PUBLICATIONS

U.S. application No. 09/022,813, Donohoe et al., filed Feb. 12, 1998.

(List continued on next page.)

*Primary Examiner*—Benjamin L. Utech
*Assistant Examiner*—Lan Vinh
(74) *Attorney, Agent, or Firm*—Wells, St. John, Roberts, Gregory & Matkin

(57) ABSTRACT

A plasma etching method includes forming a polymer comprising carbon and a halogen over at least some internal surfaces of a plasma etch chamber. After forming the polymer, plasma etching is conducted using a gas which is effective to etch polymer from chamber internal surfaces. In one implementation, the gas has a hydrogen component effective to form a gaseous hydrogen halide from halogen liberated from the polymer. In one implementation, the gas comprises a carbon component effective to getter the halogen from the etched polymer. In another implementation, a plasma etching method includes positioning a semiconductor wafer on a wafer receiver within a plasma etch chamber. First plasma etching of material on the semiconductor wafer occurs with a gas comprising carbon and a halogen. A polymer comprising carbon and the halogen forms over at least some internal surfaces of the plasma etch chamber during the first plasma etching. After the first plasma etching and with the wafer on the wafer receiver, second plasma etching is conducted using a gas effective to etch polymer from chamber internal surfaces and getter halogen liberated from the polymer to restrict further etching of the material on the semiconductor wafer during the second plasma etching. The first and second plasma etchings are ideally conducted at subatmospheric pressure with the wafer remaining in situ on the receiver intermediate the first and second etchings, and with the chamber maintained at some subatmospheric pressure at all time intermediate the first and second plasma etchings.

8 Claims, 1 Drawing Sheet

U.S. PATENT DOCUMENTS

| | | | |
|---|---|---|---|
| 5,626,775 | 5/1997 | Roberts et al. | 216/67 |
| 5,644,153 * | 7/1997 | Keller | 257/324 |
| 5,679,215 | 10/1997 | Barnes et al. | 156/646.1 |
| 5,681,424 * | 10/1997 | Saito et al. | 216/69 |
| 5,716,494 * | 2/1998 | Imai et al. | 156/643.1 |
| 5,756,400 | 5/1998 | Ye et al. | 438/710 |
| 5,780,338 * | 7/1998 | Jeng et al. | 438/253 |
| 5,788,869 | 8/1998 | Dalton et al. | 216/60 |
| 5,817,578 | 10/1998 | Ogawa | 438/714 |
| 5,830,279 | 11/1998 | Hackenberg | 134/1.1 |
| 5,843,226 * | 12/1998 | Zhao et al. | 117/97 |
| 5,843,239 * | 12/1998 | Shrotriya | 134/1.1 |
| 5,868,853 | 2/1999 | Chen et al. | 134/1.1 |
| 5,873,948 * | 2/1999 | Kim | 134/19 |
| 5,879,575 | 3/1999 | Tepman et al. | 216/68 |
| 5,935,340 * | 8/1999 | Xia et al. | 134/1.1 |
| 6,136,211 | 10/2000 | Qian et al. | 438/905 |
| 6,143,665 | 11/2000 | Hsieh | 438/710 |

OTHER PUBLICATIONS

U.S. application No. 09/080,656, Allen, III, filed May 18, 1998.

U.S. application No. 09/429,880, Donohoe et al., filed Oct. 29, 1999.

* cited by examiner

US 6,277,759 B1

PLASMA ETCHING METHODS

TECHNICAL FIELD

This invention relates to plasma etching methods.

BACKGROUND OF THE INVENTION

Plasma etchers are commonly used in semiconductor wafer processing for fabrication of contact openings through insulating layers. A photoresist layer having contact opening patterns formed therethrough is typically formed over an insulative oxide layer, such as $SiO_2$ and doped $SiO_2$. An oxide etching gas, for example $CF_4$, is provided within the etcher and a plasma generated therefrom over the wafer or wafers being processed. The etching gas chemistry in combination with the plasma is ideally chosen to be highly selective to etch the insulating material through the photoresist openings in a highly anisotropic manner without appreciably etching the photoresist itself. A greater degree of anisotropy is typically obtained with such dry plasma etchings of contact openings than would otherwise occur with wet etching techniques.

One type of plasma etcher includes inductively coupled etching reactors. Such typically include an inductive plasma generating source coiled about or at the top of the reactor chamber and an electrostatic chuck within the chamber atop which one or more wafers being processed lies. The electrostatic chuck can be selectively biased as determined by the operator. Unfortunately when utilizing etching components having both carbon and fluorine, particularly in inductively coupled etching reactors, a halocarbon polymer develops over much of the internal reactor sidewall surfaces. This polymer continually grows in thickness with successive processing. Due to instabilities in the polymer film, the films are prone to flaking causing particulate contamination. In addition, the build-up of these films can produce process instabilities which are desirably avoided.

The typical prior art process for cleaning this polymer material from the reactor employs a plasma etch utilizing $O_2$ as the etching gas. It is desirable that this clean occur at the conclusion of etching of the wafer while the wafer or wafers remain in situ within the reactor chamber. This both protects the electrostatic chuck (which is sensitive to particulate contamination) during the clean etch, and also maximizes throughput of the wafers being processed. An added benefit is obtained in that the oxygen plasma generated during the clean also has the effect of stripping the photoresist from the over the previously etched wafer.

However in the process of doing this reactor clean etch, there is an approximate 0.025 micron or greater loss in the lateral direction of the contact. In otherwords, the contact openings within the insulating layer are effectively widened from the opening dimensions as initially formed. This results in an inherent increase in the critical dimension of the circuitry design. As contact openings become smaller, it is not expected that the photolithography processing will be able to adjust in further increments of size to compensate for this critical dimension loss.

Accordingly, it would be desirable to develop plasma etching methods which can be used to minimize critical dimension loss of contact openings, and/or achieve suitable reactor cleaning to remove the polymer from the internal surfaces of the etching chamber. Although the invention was motivated from this perspective, the artisan will appreciate other possible uses with the invention only be limited by the accompanying claims appropriately interpreted in accordance with the Doctrine of Equivalents.

BRIEF DESCRIPTION OF THE DRAWINGS

Preferred embodiments of the invention are described below with reference to the following accompanying drawings.

SUMMARY OF THE INVENTION

In but one aspect of the invention, a plasma etching method includes forming a polymer comprising carbon and a halogen over at least some internal surfaces of a plasma etch chamber. After forming the polymer, plasma etching is conducted using a gas which is effective to etch polymer from chamber internal surfaces. In one implementation, the gas has a hydrogen component effective to form a gaseous hydrogen halide from halogen liberated from the polymer. The hydrogen component is preferably one or more of $H_2$, $NH_3$ and $CH_4$. The conversion of the halogen, released from the clean into a hydrogen halide, renders it substantially ineffective in etching the substrate and thus reduces the critical dimension loss. In one implementation, the gas comprises a carbon component effective to getter the halogen from the etched polymer.

In another implementation, a plasma etching method includes positioning a semiconductor wafer on a wafer receiver within a plasma etch chamber. First plasma etching of material on the semiconductor wafer occurs with a gas comprising carbon and a halogen. A polymer comprising carbon and the halogen forms over at least some internal surfaces of the plasma etch chamber during the first plasma etching. After the first plasma etching and with the wafer on the wafer receiver, second plasma etching is conducted using a gas effective to etch polymer from chamber internal surfaces and getter halogen liberated from the polymer to restrict further etching of the material on the semiconductor wafer during the second plasma etching. The first and second plasma etchings are ideally conducted at subatmospheric pressure with the wafer remaining in situ on the receiver intermediate the first and second etchings, and with the chamber maintained at some subatmospheric pressure at all time intermediate the first and second plasma etchings.

The halogen preferably comprises fluorine, chlorine or mixtures thereof. The gas at least during the second etching preferably includes oxygen, such as $O_2$;

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

It has been discovered that the polymer deposited on the internal walls of the etching chamber includes a significant concentration of fluorine. It is believed that the oxygen during the clean etching under plasma condition combines with the carbon and fluorine of the polymer liberated from the internal walls and forms carbon monoxide and carbon dioxide plus an activated or reactive fluorine species. Unfortunately, this liberated fluorine species is also apparently reactive with the silicon dioxide material on the wafer, which results in more etching of such material and the widening of the contact openings.

Figure 1:
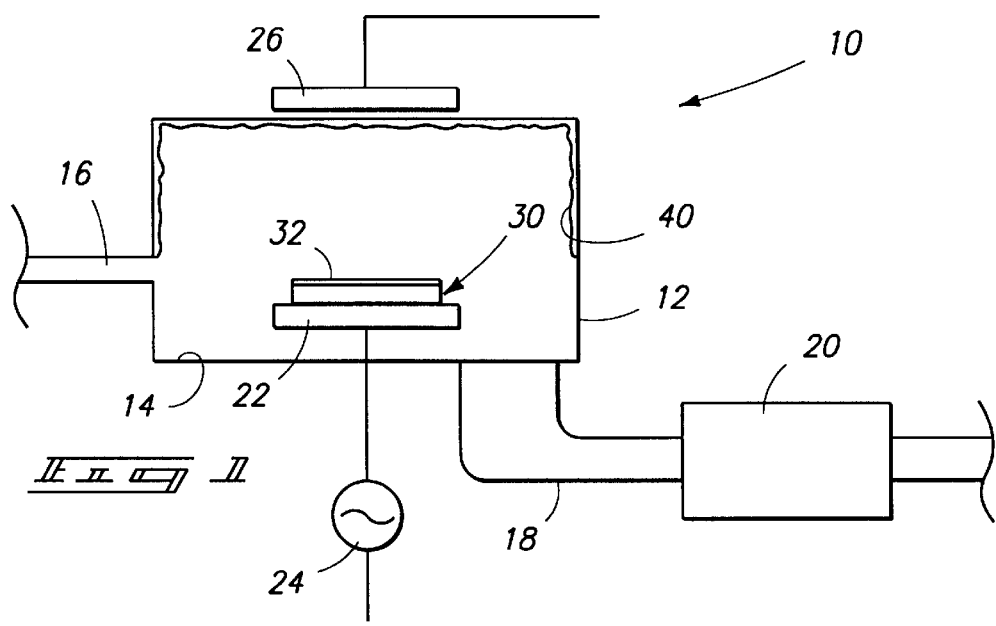
FIG. 1 is a diagrammatic view of a plasma etcher utilized at one processing step in accordance with the invention.

Referring to FIG. 1, a plasma etching reactor is indicated generally with reference numeral 10. Such includes sidewalls 12 having internal surfaces 14. One or more gas inlets 16 and one or more gas outlets 18 are provided relative to etching chamber 12. A pump 20 is associated with outlet 18 for exhausting and establishing desired subatmospheric pressure conditions within chamber 12 during processing.

Plasma etching reactor 10 in the described embodiment is configured as an inductively coupled plasma etcher having a wafer receiver 22 within chamber 12 in the form of an electrostatic chuck. A biasing source 24 is electrically coupled with receiver 22. An inductive plasma inducing source 26 is diagrammatically shown externally at the top of chamber 10.

In accordance with the preferred embodiment, a semiconductor wafer 30 is positioned upon wafer receiver 22 within chamber 12. Wafer 30 has previously been processed to have a photoresist layer 32 formed on an insulative oxide layer (not specifically shown) formed on the outer surface of wafer 30. Photoresist layer 32 has contact opening patterns (not specifically shown) formed therethrough which ideally outwardly expose selected portions of the underlying insulative oxide layer.

A desired vacuum pressure is established and maintained within chamber 12 utilizing vacuum pump 20. An example chamber pressure is from about 30 mTorr to about 5 Torr. Inductively coupled source 26 and chuck 22 are appropriately biased to enable establishment of a desired plasma within and immediately over wafer 30. An example power range for inductively coupled source 26 is from 100 watts to about 2,000 watts, with wafer receiver 22 being negatively biased to an example of 100–400 volts. Receiver 22 can have a temperature which is allowed to float, or otherwise be established and maintained at some range, for example from about −10° C. to about 40° C.

Desired etching gases are injected to within chamber 12 through inlet 16, or other inlets, to provide a desired etching gas from which an etching plasma is formed immediately over wafer 30. Such gas can comprise, for example, carbon and a halogen. An exemplary gas would be $CF_4$. Etching is conducted for a selected time to etch contact openings within the insulative oxide material on semiconductor wafer 30 through the contact opening patterns formed within photoresist layer 32. Unfortunately, a polymer layer 40 comprising carbon and the halogen, in this example fluorine, forms over some of internal surfaces 14 of plasma etch chamber 12 during such etching. Such polymer can also form over photoresist layer 32 (not specifically shown). Such provides but one example of forming a polymer comprising carbon and a halogen over at least some internal surfaces of a plasma etch chamber.

Figure 2:
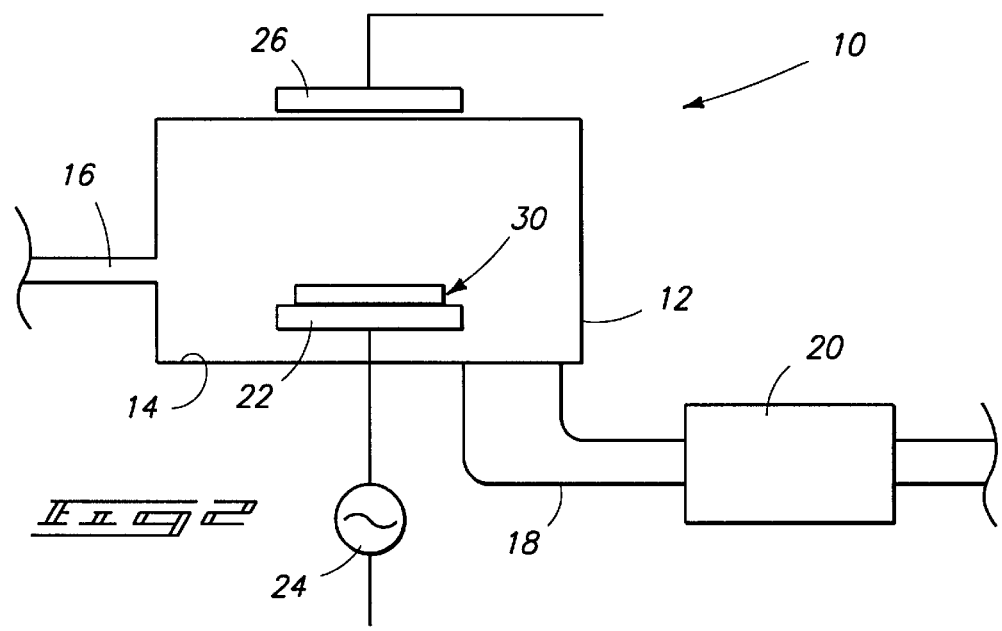
FIG. 2 is a view of the FIG. 1 apparatus and wafer at a processing step subsequent to that depicted by FIG. 1.

Referring to FIG. 2, and at the conclusion of the first plasma etching and with wafer 30 on electrostatic chuck 22, chuck 22 is ideally provided at ground or floating potential and second plasma etching is conducted using a gas effective to etch polymer from chamber internal surfaces 14. The gas ideally has one or more components effective to etch photoresist layer 32 from substrate 30 and polymer from chamber internal surfaces 14 (both being shown as removed in FIG. 2). Further, such one or more components of the gas are selected to be effective to getter halogen liberated from the polymer to restrict further etching of the insulative oxide or other previously etched material on the semiconductor wafer during the second plasma etching.

In one example, the gettering component comprises hydrogen which combines with the halogen during the second plasma etching to form a gaseous hydrogen halide which has a low reactivity with material of the semiconductor wafer, and accordingly is withdrawn from the reactor through outlet 18. Example hydrogen atom containing gases include $NH_3$, $H_2$, and $CH_4$. One example gas for providing the hydrogen component to the chamber is forming gas which consists essentially of $N_2$ at about 96% or greater and $H_2$ at about 4% or less, by volume.

In another example, the gettering component comprises a carbon compound. Examples include hydrocarbons, aldehydes (i.e., formaldehyde) and ketones (i.e., methyl ketone). Hydrocarbons will typically getter the halogen as a hydrogen halide. Where the carbon compound comprises a C—O bond which survives the processing, the halogen will typically be gettered as $COA_x$, where A is the etched halogen. One example carbon containing gettering compound having a C—O bond is CO, produced for example within the plasma from injecting $CO_2$ to within the reactor.

The gas also ideally comprises an additional oxygen component, such as $O_2$ or other material. Such facilitates etching of both polymer and photoresist over the substrate. Where the gas components comprise $O_2$ and a hydrogen atom containing component, the $O_2$ component and hydrogen atom containing component are preferably provided in the chamber during the second plasma etching at a volumetric ratio of at least 0.1:1 of $O_2$ to the hydrogen atom containing component. One reduction to practice example in a thirty-five liter high density plasma etcher included a feed for the second plasma etching of 60 sccm $NH_3$ and 1,000 sccm per minute of $O_2$. For a carbon containing compound, such is preferably provided at from about 5% to about 80% by volume of the oxygen/carbon compound mixture.

Plasma conditions within the chamber with respect to pressure and temperature and biasing power on induction source 26 can be the same as in the first etching, or different. Regardless, such first and second plasma etchings are ideally conducted at subatmospheric pressure where the wafer remains in situ on the electrostatic chuck intermediate the first and second etchings with the chamber being maintained at some subatmospheric pressure at all time intermediate the first and second plasma etchings.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A plasma etching method comprising:
   etching a semiconductor wafer with a plasma etching material, the material forming a polymer comprising carbon and a halogen over at least some internal surfaces of a plasma etch chamber; and
   after forming the polymer plasma etching using a gas effective to etch polymer from chamber internal surfaces: the gas having a hydrogen component effective to form a gaseous hydrogen halide from halogen liberated from the polymer wherein the hydrogen component comprises forming gas consisting essentially of $N_2$ at about 96% or greater and $H_2$ at about 4% or less, by volume.

2. A plasma etching method comprising:
   etching a semiconductor wafer with a plasma etching material, the material forming a polymer comprising carbon and a halogen over at least some internal surfaces of a plasma etch chamber; and after forming the polymer plasma etching using a gas effective to etch polymer from chamber internal surfaces: the gas having a hydrogen component effective to form a gaseous hydrogen halide from halogen liberated from the polymer wherein the hydrogen component comprises $CH_4$.

3. A plasma etching method comprising:

etching a semiconductor wafer with a plasma etching material, the material forming a polymer comprising carbon and a halogen over at least some internal surfaces of a plasma etch chamber; and after forming the polymer, plasma etching at subatmospheric pressure using a gas effective to etch polymer from chamber internal surfaces; the gas comprising a carbon compound effective to getter the halogen from the etched polymer wherein the carbon compound comprises an aldehyde.

4. A plasma etching method comprising:

etching a semiconductor wafer with a plasma etching material, the material forming a polymer comprising carbon and a halogen over at least some internal surfaces of a plasma etch chamber; and after forming the polymer, plasma etching at subatmospheric pressure using a gas effective to etch polymer from chamber internal surfaces: the gas comprising a carbon compound effective to getter the halogen from the etched polymer wherein the carbon compound comprises a ketone.

5. A plasma etching method comprising:

positioning a semiconductor wafer on a wafer receiver within a plasma etch chamber;

first plasma etching material on the semiconductor wafer with a gas comprising carbon and a halogen, a polymer comprising carbon and the halogen forming over at least some internal surfaces of the plasma etch chamber during the first plasma etching; and after the first plasma etching and with the wafer on the wafer receiver, second plasma etching at subatmospheric pressure using a gas effective to etch polymer from chamber internal surfaces and getter halogen liberated from the polymer to restrict further etching of the material on the semiconductor wafer during the second plasma etching wherein the gas comprises $CH_4$, with hydrogen from the $CH_4$ combining with the halogen during the second plasma etching to form a gaseous hydrogen halide.

6. A plasma etching method comprising:

positioning a semiconductor wafer on a wafer receiver within a plasma etch chamber the semiconductor wafer having a photoresist layer formed thereon:

first plasma etching material on the semiconductor wafer through openings formed in the photoresist layer with a gas comprising carbon and a halogen, a polymer comprising carbon and the halogen forming over at least some internal surfaces of the plasma etch chamber during the first plasma etching; and after the first plasma etching and with the wafer on the wafer receiver, second plasma etching at subatmospheric pressure using a gas having one or more components effective to etch photoresist from the substrate and polymer from chamber internal surfaces and getter halogen liberated from the polymer to restrict further etching of the material on the semiconductor wafer during the second plasma etching wherein one of the gas components comprises $CH_4$, with hydrogen from the $CH_4$ combining with the halogen during the second plasma etching to form a gaseous hydrogen halide.

7. A plasma etching method comprising:

positioning a semiconductor wafer on an electrostatic chuck within an inductively coupled plasma etch chamber, the semiconductor wafer having a photoresist layer formed on an insulative oxide layer, the photoresist layer having contact opening patterns formed therethrough;

first plasma etching contact openings within the insulative oxide on the semiconductor wafer through the contact opening patterns formed in the photoresist layer with a gas comprising carbon and fluorine, a polymer comprising carbon and fluorine forming over at least some internal surfaces of the plasma etch chamber during the first plasma etching; and after the first plasma etching and with the wafer on the electrostatic chuck, providing the electrostatic chuck at ground or floating potential while second plasma etching at subatmospheric pressure using a gas comprising an oxygen component and a hydrogen component effective to etch photoresist from the substrate and polymer from chamber internal surfaces, and forming HF during the second plasma etching from fluorine liberated from the polymer to restrict widening of the contact openings formed in the insulative oxide resulting from further etching of the material on the semiconductor wafer during the second plasma etching wherein the hydrogen component comprises forming gas consisting essentially of $N_2$ at about 96% or greater and $H_2$ at about 4% or less, by volume.

8. A plasma etching method comprising:

positioning a semiconductor wafer on an electrostatic chuck within an inductively coupled plasma etch chamber, the semiconductor wafer having a photoresist layer formed on an insulative oxide layer, the photoresist layer having contact opening patterns formed therethrough;

first plasma etching contact openings within the insulative oxide on the semiconductor wafer through the contact opening patterns formed in the photoresist layer with a gas comprising carbon and fluorine, a polymer comprising carbon and fluorine forming over at least some internal surfaces of the plasma etch chamber during the first plasma etching; and after the first plasma etching and with the wafer on the electrostatic chuck, providing the electrostatic chuck at ground or floating potential while second plasma etching at subatmospheric pressure using a gas comprising an oxygen component and a hydrogen component effective to etch photoresist from the substrate and polymer from chamber internal surfaces, and forming HF during the second plasma etching from fluorine liberated from the polymer to restrict widening of the contact openings formed in the insulative oxide resulting from further etching of the material on the semiconductor wafer during the second plasma etching wherein the hydrogen component comprises $CH_4$.

* * * * *